United States Patent
Ho et al.

(10) Patent No.: US 11,597,880 B2
(45) Date of Patent: Mar. 7, 2023

(54) POLYMER FILM AND METHOD FOR MANUFACTURING THE SAME

(71) Applicant: TAIMIDE TECHNOLOGY INCORPORATION, Hsinchu Hsien (TW)

(72) Inventors: Yi-Hsueh Ho, Hsinchu Hsien (TW); Meng-Ying Tsai, Hsinchu Hsien (TW)

(73) Assignee: TAIMIDE TECHNOLOGY INCORPORATION, Hsinchu Hsien (TW)

( * ) Notice: Subject to any disclaimer, the term of this patent is extended or adjusted under 35 U.S.C. 154(b) by 0 days.

(21) Appl. No.: 17/752,880

(22) Filed: May 25, 2022

(65) Prior Publication Data
US 2022/0389177 A1   Dec. 8, 2022

(30) Foreign Application Priority Data
Jun. 3, 2021   (TW) ............... 110120202

(51) Int. Cl.
| | |
|---|---|
| *C09K 19/52* | (2006.01) |
| *G02F 1/00* | (2006.01) |
| *H05K 1/03* | (2006.01) |
| *C08J 5/18* | (2006.01) |
| *C09K 19/38* | (2006.01) |

(52) U.S. Cl.
CPC ............ *C09K 19/52* (2013.01); *G02F 1/0009* (2013.01); *G02F 1/0018* (2013.01); *H05K 1/0393* (2013.01); *C08J 5/18* (2013.01); *C09K 19/3809* (2013.01); *C09K 2019/525* (2013.01); *C09K 2219/11* (2013.01); *H05K 2201/0141* (2013.01); *H05K 2201/0154* (2013.01)

(58) Field of Classification Search
CPC ........ G02F 1/00; G02F 1/0009; G02F 1/0018; H05K 1/0393; C09K 19/52
See application file for complete search history.

(56) References Cited

U.S. PATENT DOCUMENTS

| | | | |
|---|---|---|---|
| 10,538,631 B2 * | 1/2020 | Aouad | C08G 81/025 |
| 2022/0389177 A1 * | 12/2022 | Ho | C09K 19/52 |

FOREIGN PATENT DOCUMENTS

| | | |
|---|---|---|
| TW | I356834 B | 1/2012 |
| TW | I383021 B | 1/2013 |
| TW | I650358 B | 2/2019 |

\* cited by examiner

*Primary Examiner* — Dung T Nguyen

(57) ABSTRACT

A polymer film is provided, the polymer film comprises a liquid crystal polymer, comprising a soluble liquid crystal polymer and an insoluble liquid crystal polymer; and a polyimide polymer, accounting for 5 wt % or more of the polymer film. A method for manufacturing the polymer film is also provided, the method for manufacturing the polymer film comprises steps: providing a liquid crystal polymer powder, a particle size of the liquid crystal polymer powder is 0.1 um to 20 um; providing a liquid crystal polymer glue, a solid content of which is greater than 3 wt %; providing a polyamic acid glue; mixing the liquid crystal polymer powder, the liquid crystal polymer glue and the polyamic acid glue into a mixed solution, the mixed solution is made into a gel film, and the gel film is baked at a temperature of 300° C. to form a polymer film.

3 Claims, 1 Drawing Sheet

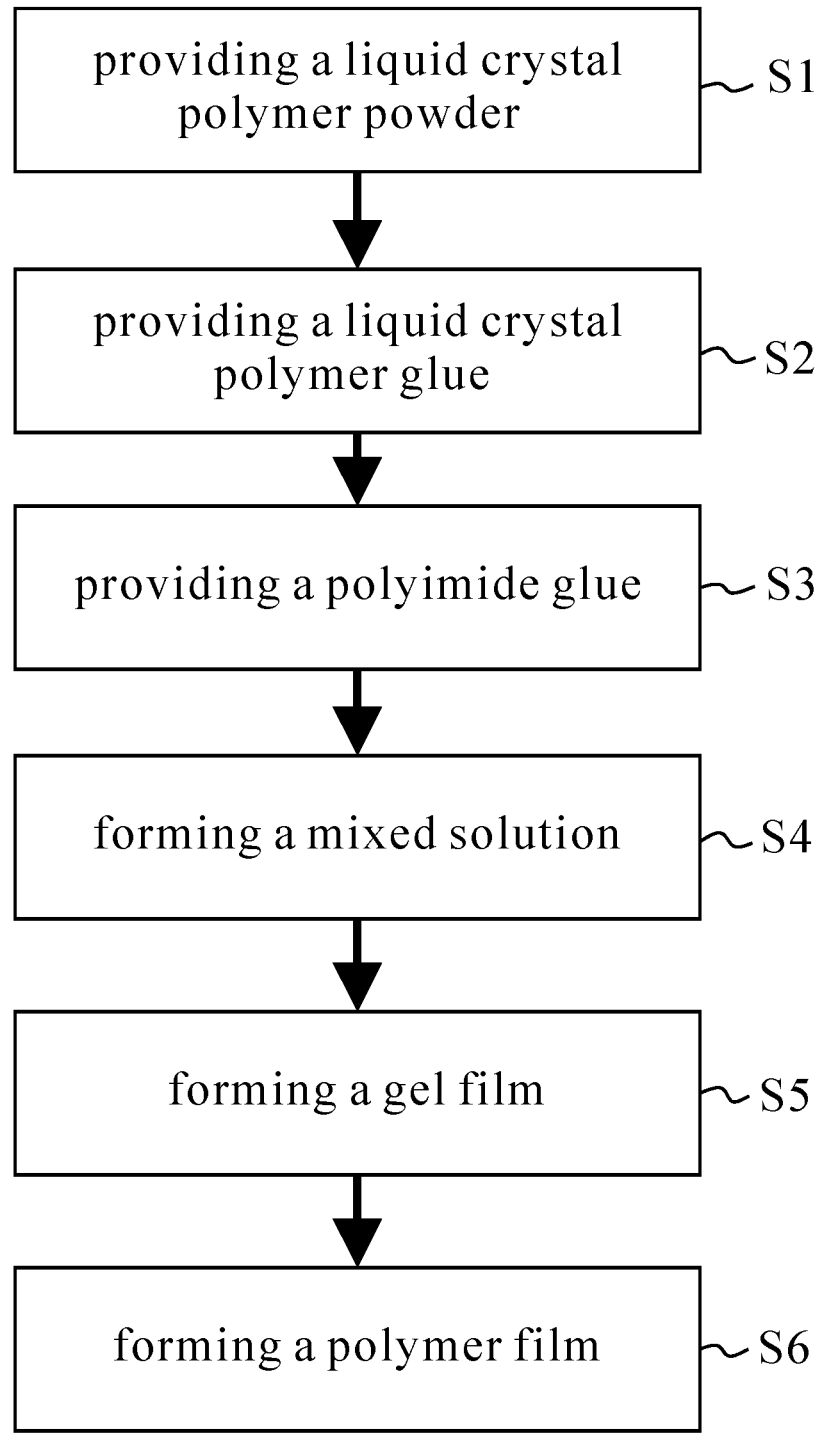

POLYMER FILM AND METHOD FOR MANUFACTURING THE SAME

CROSS-REFERENCE TO RELATED APPLICATION

This non-provisional application claims priority under 35 U.S.C. § 119(a) on Patent Application No(s). 110120202 filed in Taiwan, R.O.C. on Jun. 3, 2021, the entire contents of which are hereby incorporated by reference.

BACKGROUND OF THE INVENTION

1. Field of the Invention

The present disclosure relates to a polymer film and a method for manufacturing the same, and in particular to a polymer film comprising a soluble liquid crystal polymer, an insoluble liquid crystal polymer and a polyimide polymer, which has preferable film processability, temperature resistance and electrical properties, and the coefficient of thermal expansion is relatively low, can be applied to high-frequency materials.

2. Description of the Related Art

Although polyimide has preferable film processability and temperature resistance, it has the disadvantages of poor electricality and high water absorption, so there will be poor signal transmission problems in 5G high-frequency applications.

It is known that a film applied to high frequency is made of insoluble liquid crystal polymer, that is, a liquid crystal polymer is insoluble in solvents, the electrical properties are good, and the water absorption rate is low, but because of the high melting point, when the processing temperature is close to the liquid crystal state temperature (280 to 330° C.), the mechanical properties of the liquid crystal polymer film will drop sharply that cause the processability of the production of the film bonding with copper foil is very difficult in the application of high frequency, and the liquid crystal polymer film is easy to deform after a high temperature bonding process. Also, it has high crystallinity and molecular conformity, so in the process of film making, the molecular arrangement is easy to be in the same direction as the paint direction, which eventually leads to the difference in the mechanical properties of the vertical/horizontal direction of the film is too large, and even the film is easy to crack in the non-paint direction, which is quite difficult to produce.

The prior art of Taiwan patent publication No. 1356834 discloses a method for manufacturing a soluble liquid crystal polymer, which is to dissolve the soluble liquid crystal polymer in an organic solution, and then make a soluble liquid crystal polymer film in a coated manner, the liquid crystal polymer film produced by the method has anisotropy, and has a more balanced vertical/horizontal mechanical properties. However, the liquid crystal polymer film produced by the method has poor temperature resistance, and the coefficient of thermal expansion is relatively high (the coefficient of thermal expansion of 50° C. to 150° C. is greater than 30 ppm/° C.), and the size of the film will change drastically under the softening point Tg of about 180° C., and the coefficient of thermal expansion used by the general flexible circuit board in a temperature range of 50 to 200° C. will be greater than 100 ppm/° C., so the use will be limited.

The prior art of Taiwan patent publication No. 1650358 discloses a method for manufacturing a soluble liquid crystal polymer film, the soluble liquid crystal polymer is added with liquid crystal polymer fillers, which can effectively reduce the thermal expansion coefficient of the soluble liquid crystal polymer film to 12 to 25 ppm, but it is still unable to improve the storage elastic modulus at high temperature, so it is easy to cause deformation and warpage in the subsequent process of bonding copper foil.

The prior art of Taiwan patent publication No. 1383021 discloses a soluble liquid crystal polymer film, which is obtained by adding polyimide in a soluble liquid crystal polymer, and the resultant soluble liquid crystal polymer film can effectively reduce the thermal expansion coefficient of the film, and can also improve the mechanical properties at a high temperature. However, the addition of polyimide will increase the water absorption rate and dielectric loss tangent, which is not conducive to the application of 5G high-frequency flexible circuit boards.

BRIEF SUMMARY OF THE INVENTION

The present disclosure provides a polymer film, which comprises a liquid crystal polymer and a polyimide polymer, wherein the liquid crystal polymer comprises a soluble liquid crystal polymer and an insoluble liquid crystal polymer, the polyimide polymer accounts for 5 wt % or more of the polymer film.

The present disclosure provides a method for manufacturing the polymer film, which comprises steps: providing a liquid crystal polymer powder, wherein a particle size of the liquid crystal polymer powder is 0.1 um to 20 um; providing a liquid crystal polymer glue, a solid content of which is greater than 3 wt %; providing a polyamic acid glue; mixing the liquid crystal polymer powder, the liquid crystal polymer glue and the polyamic acid glue into a mixed solution, the mixed solution is made into a gel film, and the gel film is baked at high temperature to form a polymer film.

BRIEF DESCRIPTION OF THE DRAWINGS

FIG. 1 is a flow chart of a method for manufacturing a polymer film of the disclosure.

DETAILED DESCRIPTION OF THE INVENTION

A polymer film of the present disclosure comprises a liquid crystal polymer and a polyimide polymer, wherein the liquid crystal polymer comprises a soluble liquid crystal polymer and an insoluble liquid crystal polymer.

Among them, the soluble liquid crystal polymer refers to it is soluble in an organic solvent, the organic solvent may be dimethylacetamide (DMAc), N-methyl-pyrrolidone (NMP), N-ethyl-2-pyrrolidone (NEP), γ-butyrolactone (GBL) and N,N-dimethylformamide (DMF), the solubility reaches a weight percent concentration of 3 wt % or more, it is preferably 5 wt % or more, the present disclosure uses 8 wt % of the soluble liquid crystal polymer, a higher solid content is preferable for the operability of coating film.

The soluble liquid crystal polymer accounts for 30 wt % to 80 wt % of the polymer film;

Among them, the insoluble liquid crystal polymer accounts for 10 wt % to 60 wt % of the polymer film.

Among them, the polyimide polymer accounts for 5 wt % or more of the polymer film, and it is obtained by using a dianhydride component and a diamine component, wherein a structure of dianhydride or diamine contains ester-based functional groups.

Referring to FIG. 1, a method for manufacturing the polymer film of the present disclosure comprises providing a liquid crystal polymer powder (S1), preferably in a particle size range of 0.1 to 20 um, more preferably 0.1 to 10 um.

Providing a liquid crystal polymer glue (S2), a solid content of which is greater than 3 wt %.

Providing a polyamic acid glue (S3), it is obtained by polymerizing dianhydride and diamine, wherein the dianhydride or diamine must contain ester-based functional groups. The structure of dianhydride or diamine containing ester-based functional groups can increase the compatibility of polyimides with liquid crystal polymers.

The dianhydride or diamine monomer containing ester-based functional groups preferably accounts for 20% or more of the polyimide mole number, the polyimide preferably accounts for 50% or more of the polyimide mole number, the dianhydride or diamine containing ester-based functional groups mole number in the present disclosure accounts for 100% of the polyimide mole number.

In the present disclosure, the dianhydride or diamine must contain ester-based functional groups, in the case of dianhydride, a monomer containing ester-based functional groups is such as: 1,4-phenylene bis(1,3-dioxo-1,3-dihydroisobenzofuran-5-carboxylate) (TAHQ), cyclohexane-1,4-diylbis(methylene) bis(1,3-dioxo-1,3-dihydroisobenzofuran-5-carboxylate) (TA-CHDM), ethylene glycol bis(trimellitic anhydride) (TMEG), 1,3-dioxo-1,3-dihydroisobenzofuran-5-yl 1,3-dioxo-1,3-dihydroisobenzofuran-5-carboxylate (8CI), in an embodiment of the present disclosure, 1,4-phenylene bis(1,3-dioxo-1,3-dihydroisobenzofuran-5-carboxylate) (TAHQ) is used as the dianhydride containing ester-based functional groups.

The diamine containing an ester group may be p-aminophenyl p-aminobenzoate (APAB), bis(4-aminophenyl) terephthalate (BPTPA), [4-(4-aminobenzoyl)oxyphenyl] 4-aminobenzoate (ABHQ) and the like, in an embodiment of the present disclosure, p-aminophenyl p-aminobenzoate (APAB) is used as the diamine containing ester-based functional groups.

The dianhydride or diamine component must contain ester-based functional groups. In addition, other types of monomers and ester-containing monomers can be used to go with each other to prepare the desired characteristics, of which ester-free dianhydride components can be selected from 1,2,4,5-benzenetetracarboxylic anhydride (PMDA), 3,3',4,4'-biphenyltetracarboxylic dianhydride (BPDA), 4,4'-oxydiphthalic anhydride (ODPA), 4,4-(hexafluoroisopropylidene)diphthalic anhydride (6FDA), 3,3',4,4'-benzophenone tetracarboxylic dianhydride (BTDA), 1,2,3,4-cyclobutanetetracarboxylic dianhydride (CBDA), 4,4'-(4,4'-isopropylidenediphenoxy)diphthalic dianhydride (BPADA), 2,3,3',4'-biphenyltetracarboxylic dianhydride (α-BPDA), etc.

Among them, ester-free diamine components can be selected from p-phenylenediamine (PDA), 4,4'-oxydianiline (ODA), 3,4'-oxydianiline (34'ODA), m-phenylenediamine (mPDA), 4,4'-diaminodiphenylsulfone (44'DDS), 3,3'-diaminodiphenylsulfone (33'DDS), 4,4'-diamino-2,2'-dimethyl-1,1'-biphenyl (mTB), 2,2'-bis(trifluoromethyl)benzidine (TFMB), 2,2-bis[4-(4-aminophenoxy)phenyl]-1,1,1,3,3,3-hexafluoropropane (HFBAPP), 2,2'-bis(trifluoromethyl)-4,4'-diaminophenyl ether (6FODA), 2,2'-bis[4-(4-aminophenoxy)phenyl]propane (BAPP), 1,3-bis(3-aminophenoxy)benzene (APB-N), 4,4'-bis(4-aminophenoxy)biphenyl (BAPB), 1,3-bis(4'-aminophenoxy)benzene (TPER), 1,4-bis(4-aminophenoxy)benzene (TPEQ), 1,3-bis(3-aminophenoxy)benzene (APB-N), 4,4'-diaminobenzanilide (44'DABA), 2-(4-aminophenyl)-5-aminobenzoxazole (5BPOA), N,N'-(2,2'-bis(trifluoromethyl)-[1,1'-biphenyl]-4,4'-diyl)bis(4-aminobenzamide) (AB-TFMB).

The polyamic acid glue, the liquid crystal polymer glue and the liquid crystal polymer powder are mixed and stirred evenly to form a mixed solution (S4), and additional organic solvents can be used to adjust the solid content of the mixed solution, thereby adjusting the thickness and viscosity of the film. Among them, the organic solvents that can be mixed may be dimethylacetamide (DMAc), N-methyl-pyrrolidone (NMP), N-ethyl-2-pyrrolidone (NEP), γ-butyrolactone (GBL) and N,N-dimethylformamide (DMF). Among them, the organic solvent can be used alone or in a mixture of two or more. In the present disclosure, the preferred solvents are dimethylacetamide (DMAc) and N-methyl-pyrrolidone (NMP), wherein the more preferred choice is N-methyl-pyrrolidone (NMP).

The above mixed solution is added with a dehydrating agent and a catalyst, whereby the polyamic acid is chemically cyclized into a gel film (S5). Among them, the dehydrating agent may be acetic anhydride or benzoic anhydride, in the present disclosure, acetic anhydride is selected as the dehydrating agent; wherein the catalyst may be pyridine, 3-methylpyridine, 2-methylpyridine, 4-methylpyridine, isoquinoline, quinoline, triethylamine, wherein the preferred choice is pyridine, 3-methylpyridine, 2-methylpyridine, 4-methylpyridine, in the present disclosure, the more preferred choice is 3-methylpyridine, the catalyst and dehydrating agent may be mixed with a solvent, and added to the mixed solution after dilution, the final mixed solution is centrifuged and defoamed to remove bubbles in the solution, after defoaming is completed, a blade with a suitable gap is used to coat the defoamed mixed solution on a glass substrate. After the coating is completed, the glass substrate coated with the mixed solution is placed in a 60 to 80° C. oven, baked for 60 to 120 minutes and then taken out, and a semi-dry film is removed from the glass substrate, it is a gel film that is completed, the gel film is fixed on a metal frame, and put into a 250° C. oven to bake for 10 minutes, and then heated up to more than 300° C. to bake for 60 minutes to complete the production of a polymer film (S6). Among them, the baking temperature should preferably be greater than 300° C., and is more preferably greater than 320° C.

The polymer film of the present disclosure may also be added with other types of inorganic fillers or organic fillers to enhance the desired efficacy. For example, organic fluorinated polymers such as polytetrafluoroethylene (PTFE), tetrafluoroethylene-perfluoroalkoxy vinyl ether copolymer (PFA), etc., thereby reducing the dielectric constant of the polymer film; or inorganic fillers such as silica, alumina, etc., can be added to further improve the temperature resistance of the polymer film.

The polymer film of the present disclosure may be used in a flexible circuit substrate, comprising an insulating substrate and a covering film, in particular an insulating substrate is preferred.

Thus, the present disclosure may be used in a laminated plate which is laminated with a metal laminate, such a metal laminated plate comprises at least a metal layer and the above-described polymer film, may also comprise an adhesive layer between the metal layer and the polymer film.

There is no special limitation on the composition of the metal layer, and a single component or alloy of copper, nickel, aluminum, silver, etc., can be used. The preferable one of these is copper.

A production method of the metal layer may be electroplating method or hot pressing method.

EXAMPLES

<Detection Method>

The properties of the polymer film obtained in the following embodiments are measured by using the following methods.

Coefficient of thermal expansion (50° C. to 200° C.): it is measured according to ASTM D696 specification, using model Q400 TMA instrument produced by TA Instruments, Inc. The coefficient of thermal expansion of the polyimide film at 50 to 200° C. is measured, and the heating rate is set to 10° C./min. In order to remove the stress caused by heat treatment, the residual stress is removed by means of the first measurement, and the result of the second measurement is used as the actual value.

Water absorption rate: the film is baked at 120° C. for 30 minutes, and then placed in distilled water, standing for 24 hours, after the film is taken out, rate of weight loss is measured by using model Discovery TGA 550 thermogravimetric analyzer produced by TA Instruments, Inc. under the condition of holding temperature at 120° C. for 30 minutes.

Dielectric loss tangent $D_f$ (10 GHz): it is measured by using model E5071C ENA Network Analyzer instrument produced by Keysight Technologies, Inc. The measurement method of the present disclosure is: after the polymer film is baked in a 120° C. oven for 30 minutes, it is taken out, standing in an environment of 65% humidity for 48 hours, and then the measurement is carried out.

Dielectric Constant $D_k$ (10 GHz): it is measured by using model E5071C ENA Network Analyzer instrument produced by Keysight Technologies, Inc. The measurement method of the present disclosure is: after the polymer film is baked in a 120° C. oven for 30 minutes, it is taken out, standing in an environment of 65% humidity for 48 hours, and then the measurement is carried out.

Using DMA25 instrument manufactured by Metravib, the storage elastic modulus at 310° C. is measured:

Sample measurement range: a width of 15 mm, a length between fixtures of 20 mm
Temperature measurement range: 30° C. to 400° C.
Heating speed: 10° C./min
Dynamic force: 100 mN
Frequency: 5 Hz
Static force: 1N Example 1

Polyimide polymer: a polyamic acid glue is obtained by polymerizing diamine and dianhydride, the polyamic acid glue is subsequently closed loop by high temperature or chemical cyclization to obtain polyimide. The polyamic acid glue is prepared by dissolving 45.711 grams of APAB in 412.5 grams of dimethylacetamide, after completely dissolved, 90.871 grams of TAHQ is slowly added, after stirring 48 hours, a small amount of TAHQ is used to adjust the viscosity of the solution to 185,000 cps, it is the polyamic acid glue with the solid content of 25 wt % that is completed.

Insoluble liquid crystal polymer: using an insoluble liquid crystal polymer produced by ENEOS, model Lf-31P, a liquid crystal polymer powder with a particle size of 5 um.

Soluble liquid crystal polymer: using a liquid crystal polymer glue with a solid content of 8 wt %, which is dissolved in NMP.

Production of a Polymer Film 56.25 grams of 8 wt % liquid crystal polymer glue (soluble liquid crystal polymer) is weighed, 7.6 grams of 25 wt % polyamic acid glue is added, after stirring evenly, 2.7 grams of liquid crystal polymer powder (insoluble liquid crystal polymer) is added, after stirring evenly, 1.13 grams of acetic anhydride and 0.53 grams of 3-methylpyridine are added, the above solution is centrifuged and defoamed to remove bubbles in the solution, after defoaming is completed, a blade with a gap of 900 um is used to coat the defoamed solution on a glass substrate. After the coating is completed, the glass substrate coated with the mixed solution is placed in a 80° C. oven, baked for 60 minutes and then taken out, and a semi-dry film is removed from the glass substrate, a gel film is completed, the gel film is fixed on a metal frame, and put into a 250° C. oven to bake for 10 minutes, and then heated up to 340° C. to bake for 60 minutes to complete the production of a polymer film.

The polymer film contains insoluble liquid crystal polymers accounting for 30 wt %, soluble liquid crystal polymers accounting for 50 wt % and polyimides accounting for 20 wt %.

Example 2

Polyimide polymer: a polyamic acid glue is obtained by polymerizing diamine and dianhydride, the polyamic acid glue is subsequently closed loop by high temperature or chemical cyclization to obtain polyimide. The polyamic acid glue is made in the same way as Example 1.

Insoluble liquid crystal polymer: using an insoluble liquid crystal polymer produced by ENEOS, model Lf-31P, a liquid crystal polymer powder with a particle size of 5 um.

Soluble liquid crystal polymer: using a liquid crystal polymer glue with a solid content of 8 wt %, which is dissolved in NMP.

Production of a Polymer Film 6.84 grams of polyamic acid solution with a solid content of 25 wt % is weighed, 40.5 grams of 8 wt % liquid crystal polymer glue (soluble liquid crystal polymer) is added, after stirring evenly, 3.24 grams of liquid crystal polymer powder (insoluble liquid crystal polymer) is added, after continuously stirring to allow the solution to be homogenized, 1.02 grams of acetic anhydride and 0.46 grams of 3-methylpyridine are added, the above solution is centrifuged and defoamed to remove bubbles in the solution, after defoaming is completed, a blade with a gap of 600 um is used to coat the defoamed solution on a glass substrate. After the coating is completed, the glass substrate coated with the mixed solution is placed in a 80° C. oven, baked for 60 minutes and then taken out, and a semi-dry film is removed from the glass substrate, a gel film is completed, the gel film is fixed on a metal frame, and put into a 250° C. oven to bake for 10 minutes, and then heated up to 340° C. to bake for 60 minutes to complete the production of a polymer film.

The polymer film contains insoluble liquid crystal polymers accounting for 40 wt %, solvent-soluble liquid crystal polymers accounting for 40 wt % and polyimides accounting for 20 wt %.

Example 3

Polyimide polymer: a polyamic acid glue is obtained by polymerizing diamine and dianhydride, the polyamic acid glue is subsequently closed loop by high temperature or chemical cyclization to obtain polyimide. The polyamic acid glue is made in the same way as Example 1.

Insoluble liquid crystal polymer: using an insoluble liquid crystal polymer produced by ENEOS, model Lf-31P, a liquid crystal polymer powder with a particle size of 5 um.

Soluble liquid crystal polymer: using a liquid crystal polymer glue with a solid content of 8 wt %, which is dissolved in NMP.

Production of a Polymer Film 11.4 grams of polyamic acid solution with a solid content of 25 wt % is weighed, 2.85 grams of dimethylacetamide is added, after stirring evenly, 33.75 grams of 8 wt % liquid crystal polymer glue (soluble liquid crystal polymer) is added, after stirring evenly, 3.6 grams of liquid crystal polymer powder (insoluble liquid crystal polymer) is added, after continuously stirring to allow the solution to be homogenized, 1.70 grams of acetic anhydride and 0.77 grams of 3-methylpyridine are added, the above solution is centrifuged and defoamed to remove bubbles in the solution, after defoaming is completed, a blade with a gap of 600 um is used to coat the defoamed solution on a glass substrate. After the coating is completed, the glass substrate coated with the mixed solution is placed in a 80° C. oven, baked for 60 minutes and then taken out, and a semi-dry film is removed from the glass substrate, a gel film is completed, the gel film is fixed on a metal frame, and put into a 250° C. oven to bake for 10 minutes, and then heated up to 340° C. to bake for 60 minutes to complete the production of a polymer film.

The polymer film contains insoluble liquid crystal polymers accounting for 40 wt %, solvent-soluble liquid crystal polymers accounting for 30 wt % and polyimides accounting for 30 wt %.

Example 4

Polyimide polymer: a polyamic acid glue is obtained by polymerizing diamine and dianhydride, the polyamic acid glue is subsequently closed loop by high temperature or chemical cyclization to obtain polyimide. The polyamic acid glue is made in the same way as Example 1.

Insoluble liquid crystal polymer: using an insoluble liquid crystal polymer produced by ENEOS, model Lf-31P, a liquid crystal polymer powder with a particle size of 5 um.

Soluble liquid crystal polymer: using a liquid crystal polymer glue with a solid content of 8 wt %, which is dissolved in NMP.

Production of a Polymer Film 11.82 grams of polyamic acid solution with a solid content of 25 wt % is weighed, 2.95 grams of dimethylacetamide is added, after stirring evenly, 46.67 grams of 8 wt % liquid crystal polymer glue (soluble liquid crystal polymer) is added, after stirring evenly, 2.8 grams of liquid crystal polymer powder (insoluble liquid crystal polymer) is added, after continuously stirring to allow the solution to be homogenized, 1.75 grams of acetic anhydride and 0.80 grams of 3-methylpyridine are added, the above solution is centrifuged and defoamed to remove bubbles in the solution, after defoaming is completed, a blade with a gap of 900 um is used to coat the defoamed solution on a glass substrate. After the coating is completed, the glass substrate coated with the mixed solution is placed in a 80° C. oven, baked for 60 minutes and then taken out, and a semi-dry film is removed from the glass substrate, a gel film is completed, the gel film is fixed on a metal frame, and put into a 250° C. oven to bake for 10 minutes, and then heated up to 340° C. to bake for 60 minutes to complete the production of a polymer film.

The polymer film contains insoluble liquid crystal polymers accounting for 30 wt %, solvent-soluble liquid crystal polymers accounting for 40 wt % and polyimides accounting for 30 wt %.

Example 5

Polyimide polymer: a polyamic acid glue is obtained by polymerizing diamine and dianhydride, the polyamic acid glue is subsequently closed loop by high temperature or chemical cyclization to obtain polyimide. The polyamic acid glue is made in the same way as Example 1.

Insoluble liquid crystal polymer: using an insoluble liquid crystal polymer produced by ENEOS, model Lf-31P, a liquid crystal polymer powder with a particle size of 5 um.

Soluble liquid crystal polymer: using a liquid crystal polymer glue with a solid content of 8 wt %, which is dissolved in NMP.

Production of a Polymer Film 9.5 grams of polyamic acid solution with a solid content of 25 wt % is weighed, 2.37 grams of dimethylacetamide is added, after stirring evenly, 42.19 grams of 8 wt % liquid crystal polymer glue (soluble liquid crystal polymer) is added, after stirring evenly, 5.63 grams of liquid crystal polymer powder (insoluble liquid crystal polymer) is added, after continuously stirring to allow the solution to be homogenized, 1.41 grams of acetic anhydride and 0.64 grams of 3-methylpyridine are added, the above solution is centrifuged and defoamed to remove bubbles in the solution, after defoaming is completed, a blade with a gap of 600 um is used to coat the defoamed solution on a glass substrate. After the coating is completed, the glass substrate coated with the mixed solution is placed in a 80° C. oven, baked for 60 minutes and then taken out, and a semi-dry film is removed from the glass substrate, a gel film is completed, the gel film is fixed on a metal frame, and put into a 250° C. oven to bake for 10 minutes, and then heated up to 340° C. to bake for 60 minutes to complete the production of a polymer film.

The polymer film contains insoluble liquid crystal polymers accounting for 50 wt %, soluble liquid crystal polymers accounting for 30 wt % and polyimides accounting for 20 wt %.

Example 6

Polyimide polymer: a polyamic acid glue is obtained by polymerizing diamine and dianhydride, the polyamic acid glue is subsequently closed loop by high temperature or chemical cyclization to obtain polyimide. The polyamic acid glue is made in the same way as Example 1.

Insoluble liquid crystal polymer: using an insoluble liquid crystal polymer produced by ENEOS, model Lf-31P, a liquid crystal polymer powder with a particle size of 5 um.

Soluble liquid crystal polymer: using a liquid crystal polymer glue with a solid content of 8 wt %, which is dissolved in NMP.

Production of a Polymer Film 2.64 grams of polyamic acid solution with a solid content of 25 wt % is weighed, 62.5 grams of 8 wt % liquid crystal polymer glue (soluble liquid crystal polymer) is added, after stirring evenly, 0.63 grams of liquid crystal polymer powder (insoluble liquid crystal polymer) is added, after continuously stirring to allow the solution to be homogenized, 0.39 grams of acetic anhydride and 0.18 grams of 3-methylpyridine are added, the above solution is centrifuged and defoamed to remove bubbles in the solution, after defoaming is completed, a blade with a gap of 1200 um is used to coat the defoamed solution on a glass substrate. After the coating is completed, the glass substrate coated with the mixed solution is placed in a 60° C. oven, baked for 30 minutes, and then heated up to 80° C., baked for 60 minutes, and then taken out, and a semi-dry film is removed from the glass substrate, a gel film is completed, the gel film is fixed on a metal frame, and put into a 250° C. oven to bake for 10 minutes, and then heated up to 340° C. to bake for 60 minutes to complete the production of a polymer film.

The polymer film contains insoluble liquid crystal polymers accounting for 10 wt %, soluble liquid crystal polymers accounting for 80 wt % and polyimides accounting for 10 wt %.

Example 7

Polyimide polymer: a polyamic acid glue is obtained by polymerizing diamine and dianhydride, the polyamic acid glue is subsequently closed loop by high temperature or chemical cyclization to obtain polyimide. The polyamic acid glue is made in the same way as Example 1.

Insoluble liquid crystal polymer: using an insoluble liquid crystal polymer produced by ENEOS, model Lf-31P, a liquid crystal polymer powder with a particle size of 5 um.

Soluble liquid crystal polymer: using a liquid crystal polymer glue with a solid content of 8 wt %, which is dissolved in NMP.

Production of a Polymer Film 5.28 grams of polyamic acid solution with a solid content of 25 wt % is weighed, 54.67 grams of 8 wt % liquid crystal polymer glue (soluble liquid crystal polymer) is added, after stirring evenly, 0.63 grams of liquid crystal polymer powder (insoluble liquid crystal polymer) is added, after continuously stirring to allow the solution to be homogenized, 0.79 grams of acetic anhydride and 0.36 grams of 3-methylpyridine are added, the above solution is centrifuged and defoamed to remove bubbles in the solution, after defoaming is completed, a blade with a gap of 1200 um is used to coat the defoamed solution on a glass substrate. After the coating is completed, the glass substrate coated with the mixed solution is placed in a 60° C. oven, baked for 30 minutes, and then heated up to 80° C., baked for 60 minutes, and then taken out, and a semi-dry film is removed from the glass substrate, a gel film is completed, the gel film is fixed on a metal frame, and put into a 250° C. oven to bake for 10 minutes, and then heated up to 340° C. to bake for 60 minutes to complete the production of a polymer film.

The polymer film contains insoluble liquid crystal polymers accounting for 10 wt %, soluble liquid crystal polymers accounting for 70 wt % and polyimides accounting for 20 wt %.

Comparative Example 1

70 grams of liquid crystal polymer glue with a solid content of 8 wt % (soluble liquid crystal polymer) is weighed, the above solution is centrifuged and defoamed to remove bubbles in the solution, after defoaming is completed, a blade with a gap of 900 um is used to coat the defoamed solution on a glass substrate. After the coating is completed, the glass substrate coated with the mixed solution is placed in a 60° C. oven, baked for 30 minutes, and then heated up to 80° C., baked for 60 minutes, and then taken out, and a semi-dry film is removed from the glass substrate, a gel film is completed, the gel film is fixed on a metal frame, and put into a 250° C. oven to bake for 10 minutes, and then heated up to 320° C. to bake for 60 minutes to complete the production of a polymer film.

Comparative Example 2

60 grams of liquid crystal polymer glue with a solid content of 8 wt % (soluble liquid crystal polymer) is weighed, 2.06 grams of liquid crystal polymer powder (insoluble liquid crystal polymer) is added, after continuously stirring to allow the solution to be homogenized, the above solution is centrifuged and defoamed to remove bubbles in the solution, after defoaming is completed, a blade with a gap of 900 um is used to coat the defoamed solution on a glass substrate. After the coating is completed, the glass substrate coated with the mixed solution is placed in a 60° C. oven, baked for 30 minutes, and then heated up to 80° C., baked for 60 minutes, and then taken out, and a semi-dry film is removed from the glass substrate, a gel film is completed, the gel film is fixed on a metal frame, and put into a 250° C. oven to bake for 10 minutes, and then heated up to 340° C. to bake for 60 minutes to complete the production of a polymer film.

Comparative Example 3

A solvent-insoluble liquid crystal polymer with brand Vecstar and model CTQ-50 produced by Kuraray, Inc. is used.

Comparative Example 4

40.18 grams of liquid crystal polymer glue with a solid content of 8 wt % (soluble liquid crystal polymer) is weighed, 31.66 grams of 25 wt % polyamic acid glue is added, after stirring to allow the solution to be homogenized, the above solution is centrifuged and defoamed to remove bubbles in the solution, after defoaming is completed, a blade with a gap of 900 um is used to coat the defoamed solution on a glass substrate. After the coating is completed, the glass substrate coated with the mixed solution is placed in a 80° C. oven, baked for 60 minutes, and then taken out, and a semi-dry film is removed from the glass substrate, a gel film is completed, the gel film is fixed on a metal frame, and put into a 250° C. oven to bake for 10 minutes, and then heated up to 340° C. to bake for 60 minutes to complete the production of a polymer film.

Comparative Example 5

38 grams of 25 wt % polyamic acid glue is weighed, 9.5 grams of dimethylacetamide is added, after stirring evenly, 3.86 grams of liquid crystal polymer powder (insoluble liquid crystal polymer) is added, after stirring to allow the solution to be homogenized, the above solution is centrifuged and defoamed to remove bubbles in the solution, after defoaming is completed, a blade with a gap of 600 um is used to coat the defoamed solution on a glass substrate. After the coating is completed, the glass substrate coated with the mixed solution is placed in a 80° C. oven, baked for 60 minutes and then taken out, and a semi-dry film is removed from the glass substrate, a gel film is completed, the gel film is fixed on a metal frame, and put into a 250° C. oven to bake for 10 minutes, and then heated up to 340° C. to bake for 60 minutes to complete the production of a polymer film.

The comparison of Examples and Comparative examples is shown as the following table:

| | insoluble liquid crystal polymer wt % | soluble liquid crystal polymer wt % | polyimide polymer wt % | $D_k$ 10 GHz | $D_f$ 10 GHz | E' 310° C. GPa | CTE ppm/° C. | Water absorption rate % |
|---|---|---|---|---|---|---|---|---|
| Example 1 | 30 | 50 | 20 | 3.4 | 0.0030 | 0.21 | 5.9 | 0.28 |
| Example 2 | 40 | 40 | 20 | 3.4 | 0.0024 | 0.24 | 5.5 | 0.23 |
| Example 3 | 40 | 30 | 30 | 3.3 | 0.0023 | 0.45 | 3.5 | 0.24 |
| Example 4 | 30 | 40 | 30 | 3.4 | 0.0027 | 0.34 | 4.9 | 0.31 |
| Example 5 | 50 | 30 | 20 | 3.3 | 0.0021 | 0.21 | 5.9 | 0.18 |
| Example 6 | 10 | 80 | 10 | 3.4 | 0.0039 | 0.12 | 19.0 | 0.46 |
| Example 7 | 10 | 70 | 20 | 3.3 | 0.0036 | 0.17 | 12.4 | 0.39 |
| Comparative example 1 | | 100 | | 3.1 | 0.0043 | 0.012 | The value is too large to be measured | 0.59 |
| Comparative example 2 | 30 | 70 | — | 3.4 | 0.0034 | 0.022 | 176 | 0.46 |
| Comparative example 3 | 100 | — | — | 3.4 | 0.0020 | 0.014 | 12.0 | 0.02 |
| Comparative example 4 | — | 30 | 70 | 3.3 | 0.0062 | 0.62 | 26.8 | 0.66 |
| Comparative example 5 | 30 | — | 70 | 3.4 | 0.0053 | 0.83 | 16.3 | 0.56 |

The content of the above specific embodiments is intended to elaborate on the present disclosure, however, such embodiments are for illustrative purposes only and are not intended to limit the present disclosure. Those skilled in the art can understand various variations and modifications that could be made to the present disclosure without departing from the scope defined by the attached claims fall into a part of the present disclosure.

What is claimed is:

1. A polymer film, comprising:
   a liquid crystal polymer, comprising a soluble liquid crystal polymer and an insoluble liquid crystal polymer, the soluble liquid crystal polymer refers to it is soluble in an organic solvent, and the solubility reaches a weight percent concentration of 3 wt % or more, the soluble liquid crystal polymer accounts for 30 wt % to 80 wt % of the polymer film, the insoluble liquid crystal polymer accounts for 10 wt % to 60 wt % of the polymer film; and a polyimide polymer, accounting for 5 wt % or more of the polymer film.

2. The polymer film according to claim 1, wherein the organic solvent is selected from dimethylacetamide (DMAc), N-methyl-pyrrolidone (NMP), N-ethyl-2-pyrrolidone (NEP), γ-butyrolactone (GBL) and N,N-dimethylformamide (DMF).

3. The polymer film according to claim 1, wherein the polyimide polymer is obtained by using a dianhydride component and a diamine component, a structure of dianhydride or diamine contains ester-based functional groups.

* * * * *